(12) United States Patent
Fastow et al.

(10) Patent No.: US 6,754,109 B1
(45) Date of Patent: Jun. 22, 2004

(54) METHOD OF PROGRAMMING MEMORY CELLS

(75) Inventors: Richard Fastow, Cupertino, CA (US); Sameer Haddad, San Jose, CA (US); Zhigang Wang, San Jose, CA (US); Sheung-Hee Park, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/282,847

(22) Filed: Oct. 29, 2002

(51) Int. Cl.$^7$ ................................................ G11C 16/04
(52) U.S. Cl. ............................ 365/185.28; 365/185.18; 365/185.27
(58) Field of Search ...................... 365/185.18, 185.27, 365/185.28, 185.33

(56) References Cited

U.S. PATENT DOCUMENTS

| | | | |
|---|---|---|---|
| 4,698,787 A | 10/1987 | Mukherjee et al. | ......... 365/185 |
| 5,120,671 A | 6/1992 | Tang et al. | ................. 437/43 |
| 5,553,020 A | * 9/1996 | Keeney et al. | ........ 365/185.19 |
| 5,642,311 A | 6/1997 | Cleveland et al. | ...... 365/185.3 |
| 5,656,513 A | 8/1997 | Wang et al. | ............... 438/262 |
| 5,742,541 A | * 4/1998 | Tanigami et al. | ........ 365/185.3 |
| 5,793,678 A | * 8/1998 | Kato et al. | ............ 365/185.27 |
| 6,002,611 A | * 12/1999 | Ogura et al. | ........... 365/185.28 |
| 6,005,809 A | * 12/1999 | Sung et al. | ........... 365/185.29 |
| 6,330,190 B1 | * 12/2001 | Wang et al. | ........... 365/185.28 |

* cited by examiner

*Primary Examiner*—Son Mai

(57) ABSTRACT

In the present method of programming a selected flash EEPROM memory cell of a pair thereof in series, a positive voltage is applied to the drain of the selected cell to be programmed, a voltage lower than the voltage applied to the drain is applied to the source of the selected cell, a negative voltage is applied to the substrate, and a positive voltage is applied to the control gate sufficient to induce hot electron injection from the drain to the floating gate of the selected cell.

9 Claims, 2 Drawing Sheets

1

METHOD OF PROGRAMMING MEMORY CELLS

BACKGROUND OF THE INVENTION

1. Technical Field

This invention relates generally to programmable semiconductor memories, and more particularly, to the configuration of a memory device incorporating flash memory cells.

2. Cross-Reference to Related Case

This case is related to FLASH MEMORY ARRAY ARCHITECTURE AND METHOD OF PROGRAMMING, ERASING, AND READING THEREOF, invented by Sameer Haddad, filed Dec. 11, 2001, Ser. No. 10/013,993.

3. Background Art

A type of programmable memory cell is commonly referred to as a flash memory cell. Such flash memory cell may include a source and a drain formed in a silicon substrate, or in a well that is formed in the silicon substrate. The flash memory cell includes a stacked gate structure formed on the silicon substrate. The region of the silicon substrate beneath the stacked gate structure is known as the channel region of the flash memory cell.

The stacked gate structure of the flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer. A memory cell of this type is shown and described in U.S. Pat. No. 4,698,787, "Single Transistor Electrically Programmable Memory Device and Method", issued to Mukherjee et al. on Oct. 6, 1987.

Programming operations on a flash memory cell involve the application of a relatively large constant voltage to the drain of the flash memory cell while an even larger voltage is applied to the control gate. During such a programming operation, the source of the flash memory cell is maintained at a ground level or a zero voltage level in relation to the voltages applied to the control gate and drain. The high constant voltage applied to the control gate raises the voltage potential of the floating gate to a high level at the start of the programming operation. Such a high voltage potential on the floating gate attracts the electrons floating through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of the flash memory cell to cause conduction through the channel region during the read operation on the flash memory cell.

In a typical memory array which includes a large number of cells, a cell can be programmed by applying programming voltages of approximately 9–10 volts to the control gate, approximately 5 volts to the drain, and grounding the source. These voltages cause hot electrons to be injected from a drain depletion region into the floating gate. Upon removal of the programming voltages, the injected electrons are trapped in the floating gate and create a negative charge therein that increases the threshold of the cell to a value in excess of approximately 4 volts.

A cell can be read by applying a voltage of approximately 5 volts to the control gate, applying approximately 1 volt to the bit line to which the drain is connected, grounding the source, and sensing the bit line current. If the cell is programmed and the threshold voltage is relatively high (5 volts), the bit line current will be zero or relatively low. If the cell is not programmed or is erased, the threshold voltage will be relatively low (2 volts), the control gate voltage will enhance the channel, and the bit line current will be relatively high.

A cell can be erased in several ways. In one approach, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of –10 volts to the control gate, applying 5 volts to the source and allowing the drain to float can also erase the cell. Another method of erasing a cell is by applying 5 volts to the P well and –10 volts to the control gate while allowing the source and drain to float.

In such a typical prior art cell, during the programming of a cell, a relatively high voltage of 9–10 volts is applied to the control gate. In a modern memory array wherein the supply voltage is for example 5 volts, providing this relatively high voltage to the control gate for proper programming of the cell has proven problematical. This is because the ability to provide voltages within the circuit which are higher than the supply voltage is greatly limited. However, with a typical supply voltage of for example 5 volts, and with 5 volts applied to the control gate of the transistor to be programmed, the electric field formed by the applied voltages to induce hot electrons to be injected from the drain depletion region into the floating gate is insufficient to cause the cell to be programmed properly and in a rapid manner.

Therefore, what is needed is a method for programming cells of a memory array which provides an effective and rapid programming thereof, meanwhile with the supply voltage to the memory array being low.

DISCLOSURE OF THE INVENTION

In the present method of programming a memory cell of a flash EEPROM memory cell array, the array is defined in a semiconductor substrate. The cell includes in the substrate an N type source, a P type channel, and an N type drain. A floating gate is positioned over the channel, and a control gate is positioned over the floating gate. In the present method, a positive voltage is applied to the drain of the cell to be programmed, a voltage lower than the voltage applied to the drain is applied to the source of the selected cell, a negative voltage is applied to the substrate, and a positive voltage is applied to the control gate of the selected cell sufficient to induce hot electron injection from the drain to the floating gate of the selected cell.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
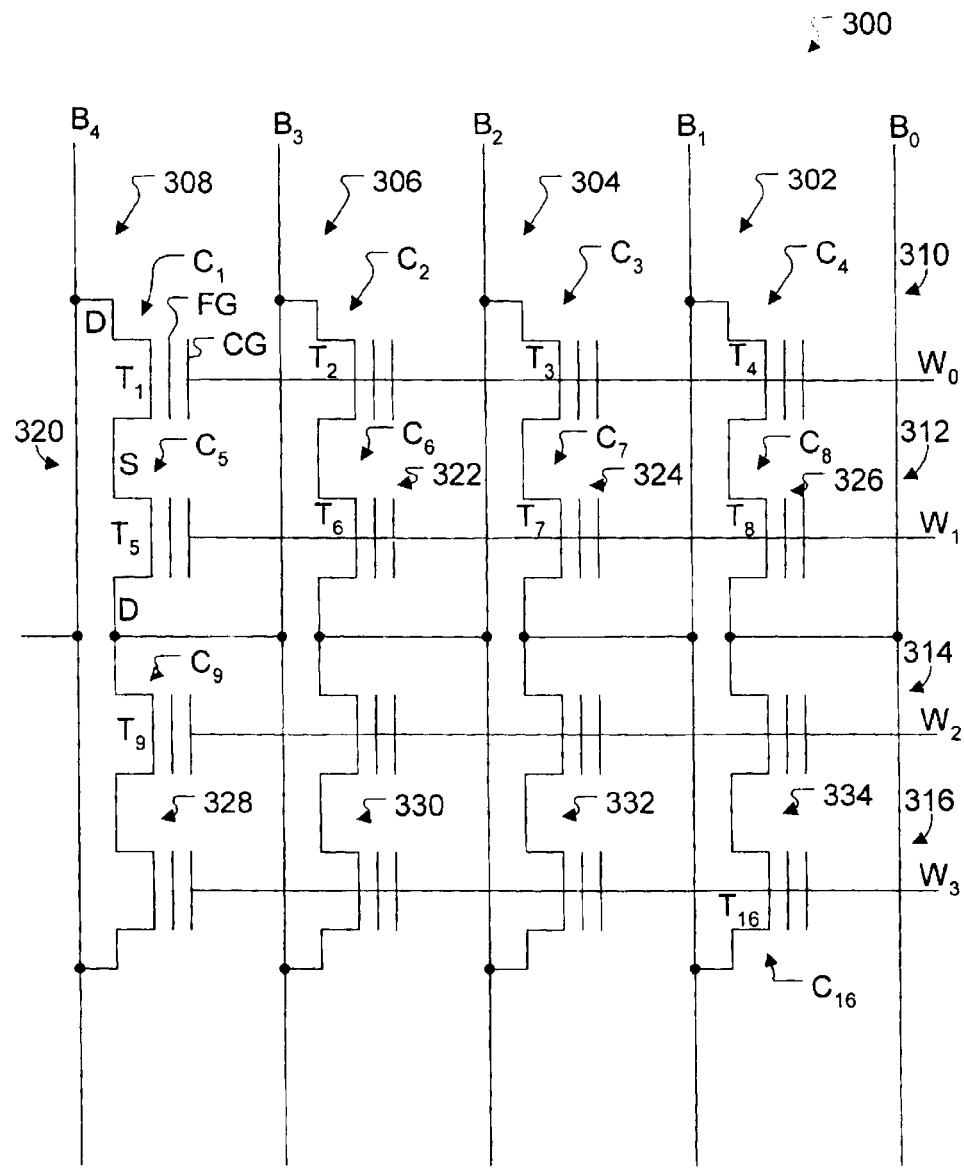
FIG. 1 is a schematic view of the present memory array for purposes of illustrating the present invention.

FIG. 1 illustrates the memory array 300 of the present invention. The array 300 is formed in a substrate 301 (see FIGS. 2–4) and includes individual cells C1–C16 made up of respective MOS field effect transistors T1–T16, each of the transistors including an N type source S and an N type drain D separated by a P type channel, all formed in substrate 301, a floating gate FG over the channel and a control gate CG over the floating gate FG, the control gate CG and substrate 301 separated by tunnel oxide, the floating gate and control gate being separated by oxide as described above. The cells C1–C16 are arranged in an array of columns 302, 304, 306, 308 and rows 310, 312, 314, 316. The array 300 includes a plurality of sets 320, 322, 324, 326, 328, 330, 332, 334 of transistors, each set (for example set 326) including a pair of transistors (T4, T8) in series. The drain of one of the pair of transistors in series (for example T4 of the pair T4, T8) is connected to a bit line (B1), and the drain of the other of the pair of transistors (T8 of the pair T4, T8) is connected to a next adjacent bit line (B0), with the transistors (T4, T8) of the pair having a common source, so that each such set of series-connected transistors is connected between adjacent bit lines (B1, B0). One of each pair of transistors (for example T4 of the pair T4, T8) has its control gate connected to a word line (W0), and the other of each such pair of transistors (T8) has its control gate connected to the next adjacent word line (W1).

As set forth in the above cited Related Case, this configuration of memory array provides certain significant advantages over a typical NOR or NAND memory array. For example, that configuration avoids the complications of self aligned source processing and lends itself well to scaling.

However, programming and reading of a cell (of a pair of cells in series between word lines) in the environment of a low, for example 5 volt supply, presents certain challenges. As pointed out above, the ability to provide voltages within a circuit which are higher than the supply voltage is limited. Thus, as a practical matter, the voltage which can be applied to the control gates of the transistors in series is limited to 5 volts. In order to program or read one of the cells in series, the transistor of the other cell in series must be fully turned on so as to act as a pass transistor. Since it is generally required that the threshold voltage of a transistor be at least 2 volts less than the voltage applied to the control gate for the transistor to be fully turned on, the threshold voltage of such a transistor must as a practical matter be 3 volts or less in this environment. In the case where a cell is unprogrammed, the threshold voltage of the transistor thereof is for example 1 volt, so the transistor can readily be fully turned on upon application of 5 volts to the control gate thereof. However, in the case where a transistor of a programmed cell is to act as a pass transistor, the transistor must be programmed so that the threshold voltage thereof is limited to 3 volts or less, but with the threshold voltage sufficiently high so as to differentiate itself from an unprogrammed cell. Meanwhile, this programming should be achieved in a rapid and accurate manner.

Figure 2:
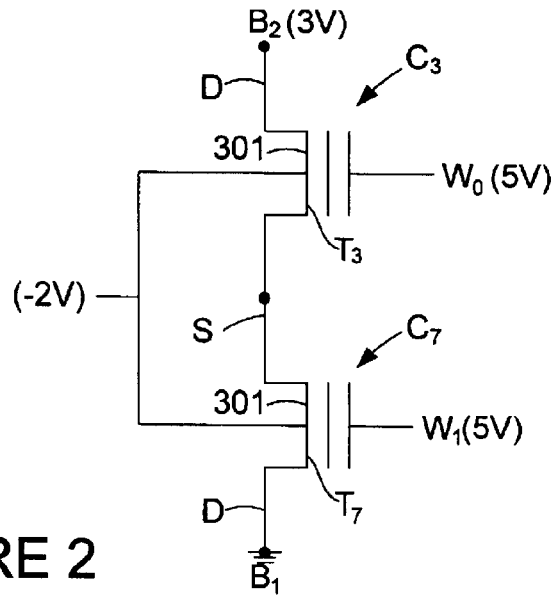
FIG. 2 is a schematic view of a series-connected pair of transistors of the array of FIG. 1, illustrating programming of a cell.
Figure 3:
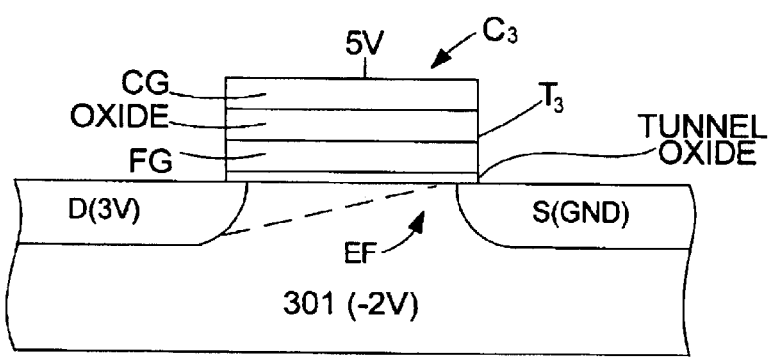
FIG. 3 is a sectional view illustrating programming of the cell of FIG. 2.
Figure 4:
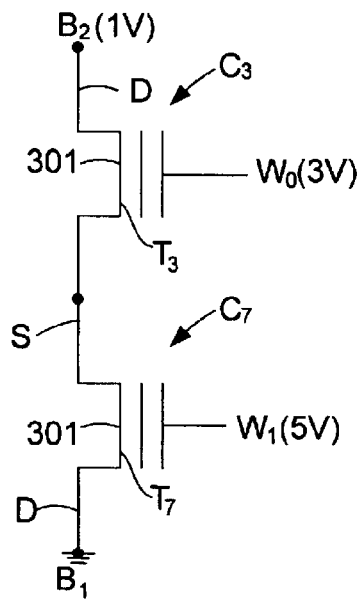
FIG. 4 is a schematic view of the series-connected pair of transistors of the array as shown in FIG. 2, illustrating reading of a cell.

FIG. 2 illustrates a pair of cells C3, C7 in series between adjacent bit lines B2, B1, which illustration is typical of pairs of cells in the array. In the programming of cell C3, assuming the cell C7 is unprogrammed, bit line B1 is grounded, and 5 volts is applied to the control gate of the transistor T7 of the cell C7 so that it behaves as a pass transistor, allowing full conduction therethrough to ground. Meanwhile, 3 volts is applied to bit line B2 and the drain of the transistor T3, a constant 5 volts or slightly less is applied to the control gate of the transistor T3, and a negative bias of −2 volts is applied to the substrate 301 of both the transistors T3, T7. As illustrated in FIG. 3, the negative bias on the substrate 301 causes the electric field EF near the source to be increased as compared to the situation where such negative bias is not applied. This causes an increase in speed of transfer of electrons from the drain through the tunnel oxide to the floating gate in the programming of the cell C3. Meanwhile, with 3 volts being supplied to the drain of the transistor T3, it is ensured that the threshold voltage of the programed cell C3 will be 3 volts or slightly less.

Assuming that the cell C7 is in a programmed state as thus described, the programming of the cell C3 is achieved in the same manner. That is, with bit lines B2, B1 biased as set forth above, and with the transistor T7 of cell C7 having a threshold voltage of 3 volts or slightly less, application of 5 volts to the control gate thereof insures that such transistor T7 is fully turned on so as to act as a pass transistor. Meanwhile, 3 volts is applied to the drain of the transistor T3, and a constant 5 volts or slightly less is applied to the control gate of that transistor T3, with the substrate being biased at −2 volts. Thus, programming of the cell C3 in a proper and rapid manner is achieved in this environment also. As will be noted, the proper and rapid programming of cells is achieved through the application of a negative voltage to the substrate 301. This is so even with low voltages being applied to the control gates of the transistors.

During reading of for example cell C3, with the substrate 301 no longer being negatively biased, 5 volts are applied to the control gate of the transistor T7 which is to act as a pass transistor, this voltage being sufficient to fully turn on the transistor T7 whether or not it is programmed. Meanwhile, a voltage of for example 1 volt is applied to the drain of the transistor T3 of the cell C3, and a voltage of for example 3 volts is applied to the control gate of the transistor T3 of the cell C3, which voltage is sufficient to turn on the transistor T3 to provide conduction therethrough if the cell C3 is unprogrammed, but which is insufficient to turn on the transistor T3 if the cell C3 is programmed. Thus, a reading of current from bit line B2 to bit line B1 reveals whether the cell C3 is programmed or unprogrammed.

In erasing a cell, a positive bias, for example 5 volts, is applied to the substrate 301, and a sufficiently lower voltage is applied to the control gate of the transistor of the cell to be erased.

As set forth above, application of a negative voltage bias to the substrate 301 during programming of a cell provides for rapid and effective programming of the cell, even in the environment wherein a low voltage, for example 5 volts, is applied to the control gate of the transistor thereof.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming a memory cell of a flash EEPROM memory cell array, the array being defined in a semiconductor substrate, the cell including in the substrate an N type source, a P type channel, and an N type drain, and further including a floating gate positioned over the channel and a control gate positioned over the floating gate, the method comprising:

applying a positive voltage to the drain of the cell selected to be programmed;

applying a voltage to the source of the selected cell which is lower than the voltage applied to the drain of the selected cell;

applying a negative voltage to the substrate; and applying a constant positive voltage of 5 volts or less to the control gate of the selected cell of a level sufficient to induce hot electron injection from the drain to the floating gate of the selected cell.

2. The method of claim 1 and further comprising the steps of providing approximately −2 volts to the substrate.

3. The method of claim 2 and further comprising the step of applying approximately 3 volts to the drain.

4. A method of programming a memory cell, which cell is one of a plurality of memory cells connected in series between first and second bit lines of a flash EEPROM memory cell array, the array being defined in a semiconductor substrate, each cell including in the substrate an N type source, a P type channel, and an N type drain, and further including a floating gate positioned over the channel and a control gate positioned over the floating gate, the method comprising:

applying a positive voltage to the drain of the cell selected to be programmed;

applying a voltage to the source of the selected cell which is lower than the voltage applied to the drain of the selected cell;

applying a negative voltage to the substrate; and applying a positive voltage to the control gate of the selected cell of a level sufficient to induce hot electron injection from the drain to the floating gate of the selected cell.

5. The method of claim 4 and further comprising the step of providing that the plurality of memory cells connected in series between first and second bit lines consists of first and second memory cells connected in series between first and second bit lines.

6. The method of claim 5 and further comprising the step of applying a voltage to the control gate of the second memory cell sufficient to cause the second memory cell to conduct while programming the first memory cell.

7. The method of claim 4 and further comprising the steps of providing approximately −2 volts to the substrate of the selected cell.

8. The method of claim 7 and further comprising the step of applying 5 volts or less to the control gate of the selected cell.

9. The method of claim 8 and further comprising the step of applying approximately 3 volts to the drain.

* * * * *